US008552906B2

(12) United States Patent
Kolmhofer et al.

(10) Patent No.: US 8,552,906 B2
(45) Date of Patent: Oct. 8, 2013

(54) METHOD AND CIRCUIT FOR OPERATING A MIXER

(76) Inventors: Erich Kolmhofer, Linz (AT); Dietmar Kissinger, Erlangen (DE); Florian Starzer, Ennsdorf bei Enns (AT)

( * ) Notice: Subject to any disclaimer, the term of this patent is extended or adjusted under 35 U.S.C. 154(b) by 418 days.

(21) Appl. No.: 12/722,511

(22) Filed: Mar. 11, 2010

(65) Prior Publication Data

US 2010/0233981 A1 Sep. 16, 2010

(30) Foreign Application Priority Data

Mar. 12, 2009 (DE) .......................... 10 2009 012 913

(51) Int. Cl.
G01S 7/40 (2006.01)
H04B 1/16 (2006.01)

(52) U.S. Cl.
USPC ............................. 342/100; 342/173; 455/209

(58) Field of Classification Search
USPC ............. 342/89, 100, 13, 173–175; 455/209, 455/180
See application file for complete search history.

(56) References Cited

U.S. PATENT DOCUMENTS

| | | | | |
|---|---|---|---|---|
| 4,450,589 A * | 5/1984 | Eilers et al. | .................. | 455/205 |
| 4,767,997 A * | 8/1988 | Nielsen | .................. | 327/1 |
| 4,856,084 A * | 8/1989 | Richards, Jr. | .................. | 455/223 |
| 5,152,010 A * | 9/1992 | Talwar | .................. | 455/136 |
| 5,546,088 A * | 8/1996 | Trummer et al. | .................. | 342/124 |
| 5,802,463 A * | 9/1998 | Zuckerman | .................. | 455/208 |
| 6,426,680 B1 * | 7/2002 | Duncan et al. | .................. | 331/34 |
| 6,704,557 B1 * | 3/2004 | Krishnamurthy et al. | . | 455/278.1 |
| 7,269,144 B2 * | 9/2007 | Gardenfors et al. | .................. | 370/280 |
| 7,417,516 B2 * | 8/2008 | Singh | .................. | 333/109 |
| 7,576,687 B2 * | 8/2009 | Forstner | .................. | 342/175 |
| 7,773,026 B2 * | 8/2010 | Kolmhofer | .................. | 342/74 |
| 7,860,196 B2 * | 12/2010 | Cheah et al. | .................. | 375/344 |
| 8,055,253 B2 * | 11/2011 | Jung et al. | .................. | 455/423 |
| 2006/0160512 A1 * | 7/2006 | Lim et al. | .................. | 455/255 |
| 2006/0160534 A1 * | 7/2006 | Jung et al. | .................. | 455/423 |
| 2006/0211390 A1 * | 9/2006 | Uozumi et al. | .................. | 455/180.3 |
| 2006/0214842 A1 * | 9/2006 | Takenoshita et al. | .................. | 342/175 |
| 2006/0226903 A1 * | 10/2006 | Muller et al. | .................. | 330/149 |
| 2007/0285183 A1 * | 12/2007 | Forstner | .................. | 331/107 DP |
| 2008/0166978 A1 * | 7/2008 | Cheah et al. | .................. | 455/75 |
| 2008/0278370 A1 * | 11/2008 | Lachner et al. | .................. | 342/200 |
| 2009/0096477 A1 * | 4/2009 | Forstner | .................. | 324/763 |
| 2010/0233981 A1 * | 9/2010 | Kolmhofer et al. | .................. | 455/209 |

FOREIGN PATENT DOCUMENTS

| | | |
|---|---|---|
| DE | 69427579 T2 | 4/2002 |
| DE | 102009012913 A1 * | 9/2010 |
| DE | 102009026767 A1 * | 12/2010 |
| JP | 10221171 A * | 8/1998 |

OTHER PUBLICATIONS

Schafer, G.E.; , "A Modulator for Microwave Mixers (Correspondence)," Microwave Theory and Techniques, IRE Transactions on , vol. 6, No. 3, pp. 333-334, Jul. 1958.*

(Continued)

Primary Examiner — John B Sotomayor
(74) Attorney, Agent, or Firm — Infineon Technologies AG Patent Department

(57) ABSTRACT

A mixer for mixing a received signal and a local oscillator signal is provided. The local oscillator signal is modulated by means of a modulation signal and the modulated local oscillator signal is injected into the received signal.

25 Claims, 1 Drawing Sheet

(56) References Cited

OTHER PUBLICATIONS

Cardinal, F.; Hongming An; Mag, I.; Smith, R.; , "A high-performance broadband MMIC PHEMT resistive drain mixer for 28-40 GHz band PCN applications," Microwave and Millimeter-Wave Monolithic Circuits Symposium, 1996. Digest of Papers., IEEE 1996 , vol., no., pp. 47-50, Jun. 16-18, 1996.*

* cited by examiner

METHOD AND CIRCUIT FOR OPERATING A MIXER

RELATED APPLICATION INFORMATION

This application claims priority from German Patent Application No. 10 2009 012 913.8, which was filed on Mar. 12, 2009.

BACKGROUND

Heterodyne receivers involve a received radio-frequency signal being mixed with a radio-frequency signal from a local oscillator. This principle is also applied in radar receivers. The received radio-frequency signal and the local oscillator signal can be mixed in a mixer in this case.

SUMMARY OF THE INVENTION

In one embodiment a mixer for mixing a local oscillator signal and a received signal is provided. The local oscillator signal is modulated with a modulation signal and the modulated local oscillator signal is coupled into the path of the received signal. Methods for operating a mixer configured to mix a local oscillator signal and a received signal are also disclosed.

DETAILED DESCRIPTION

The following detailed description explains exemplary embodiments. The description is not to be taken in a limiting sense, but is made only for the purpose of illustrating the general principles of embodiments while the scope of protection is only determined by the appended claims.

Figure 1:
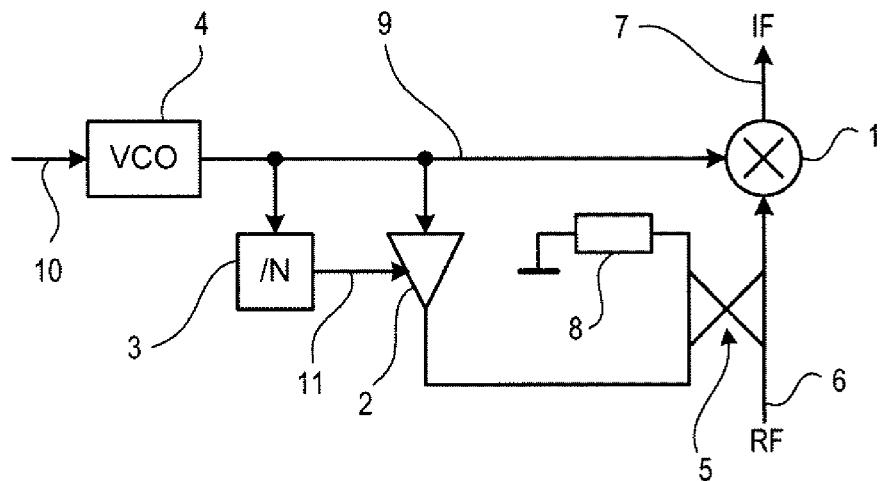
FIG. 1 shows a circuit with a mixer based on a first embodiment.

FIG. 1 shows a circuit arrangement with a mixer 1 for mixing a local oscillator signal 9 with a received signal 6. The local oscillator signal 9 is produced by a local oscillator 4 which is in the form of a voltage-controlled oscillator. The local oscillator 4 has an input 10 which can be used to influence the frequency of the local oscillator 4.

The local oscillator signal 9 is supplied to a mixer 1 to which a received signal 6 is supplied at a further input. The received signal 6 is a received radio-frequency signal which has been received by an antenna, for example, and, in one exemplary embodiment, may also be a received radar signal.

The local oscillator signal 9 is also supplied to a frequency divider 3 which divides the frequency of the local oscillator signal 9 by a factor N. In addition, the local oscillator signal 9 is supplied to an input of a modulator 2, which, in the present exemplary embodiment, is an amplitude modulator 2 and receives a modulation signal 11 at a modulation input. The modulation signal 11 is the output signal from the frequency divider 3. The amplitude modulator 2 modulates the local oscillator signal 9 by means of the modulation signal 11.

If the local oscillator signal 9 has the frequency f_VCO and the modulation signal 11 has the frequency f_mod, the signal at the output of the amplitude modulator 2 therefore has components of the frequencies f_VCO, f_VCO−f_mod and f_VCO+f_mod.

The output of the amplitude modulator 2 is coupled to a directional coupler 5 which is coupled to the path for the received signal 6 such that it injects a portion of the output signal from the amplitude modulator 2 into the received signal and hence into the input of the mixer 1 for the received signal 6. The signal path of the directional coupler 5 for the output signal from the amplitude modulator 2 is ground-terminated with a resistor 8.

One input of the mixer 1 is therefore provided with a component at the frequency f_VCO, and the other input thereof is provided with components of the frequencies f_VCO, f_VCO−f_mod and f_VCO+f_mod, components of the received signal 6 being ignored.

If the mixer 1 is operating properly, the mixing means that its output 7 also produces a component of the frequency f_mod, inter alia. The occurrence of said component can be used to test that the mixer 1 is operating properly.

The circuit arrangement shown in FIG. 1 is part of a radar reception system which processes a radar signal as received signal 6. The circuit arrangement can be operated in a test mode and in a normal reception mode. In test mode, the amplitude modulator 2 and the frequency divider 3 are switched on, so that the directional coupler 5 injects the frequency components f_VCO, f_VCO−f_mod and f_VCO+f_mod into the path of the received signal 6 and hence into the relevant input of the mixer 1.

In reception mode, at least the amplitude modulator 2 is switched off, so that no additional signal components are injected into the received signal 6 and the output 7 of the mixer 1 has only the signal components which are to be expected in normal operation.

By switching on the amplitude modulator 2, it is therefore possible, without further changeover of the signal paths for the input signals for the mixer 1, to feed in a test signal which allows the mixer 1 to be tested. This allows the mixer 1 to be tested with minimal intervention in the circuit arrangement.

In one embodiment the local oscillator signal is modulated and injected into the received signal. The modulation can be effected as amplitude modulation, phase modulation, frequency modulation or as a hybrid form of these types of modulation. The embodiment of the modulator is geared to the modulation method which is to be performed by the modulator. The modulator used may also be an up-conversion mixer. In this way, the mixer can be tested using available signals with little complexity. The mixer is used for down-converting a radio-frequency received signal to a lower intermediate frequency, to which end the received signal is mixed with the local oscillator signal. The mixing may be in the form of multiplication of the received signal and the local oscillator signal.

The output of the modulator delivers the local oscillator signal modulated with the modulation signal. If the local oscillator signal has a frequency f_VCO and the modulation signal has a frequency f_mod and the modulator is an amplitude modulator, the output signal from the modulator has components of the frequencies f_VCO, f_VCO−f_mod and f_VCO+f_mod, with further sidebands possibly being able to arise.

The output signal from the modulator is injected into the received signal using a coupler, and hence into the input of the mixer for the received signal or the radio-frequency signal, so that the output of the mixer produces a signal at the frequency f_mod, with relatively high harmonics possibly also being able to arise.

The occurrence of a component of a frequency f_mod of the modulation signal at the output of the mixer can be used as evidence of the proper operation of the mixer. In addition, the amplitude of the modulation signal at the output of the mixer can be used to estimate the conversion gain.

In addition, the modulator can be switched on and off periodically and the periodic occurrence of the frequency component f_mod can be looked out for. The detection of the frequency component f_mod can be synchronized to the switching-on of the modulator.

In one embodiment, the circuit arrangement may be set up as part of a receiver circuit such that the signal paths leading to the mixer for the local oscillator signal and for the received signal are connected in exactly the same way in normal reception mode as in a test mode of operation. In the test mode of operation, the modulator can be switched on.

In this way, the test is performed under very realistic conditions, since changeover between the normal reception mode and the test mode involves few and particularly no changes to the signal paths being made. Under some circumstances, it is also possible to dispense with changeover of the signal paths completely.

Figure 2:
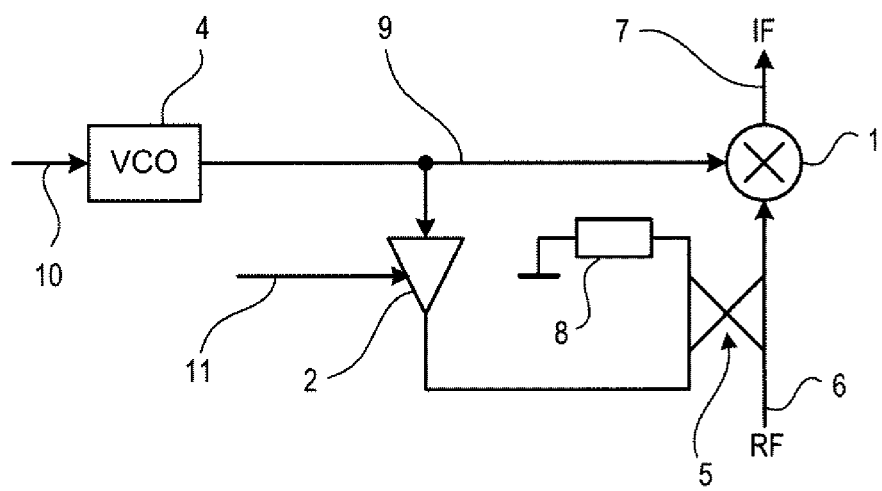
FIG. 2 shows a circuit with a mixer based on a second embodiment.

FIG. 2 shows a circuit arrangement according to a further exemplary embodiment which essentially corresponds to the circuit arrangement shown in FIG. 1. The difference is that the modulation signal 11 originates from a source which is not shown and is not derived from the local oscillator signal 9 by means of a frequency divider. In this exemplary embodiment, the modulation signal 11 can be supplied externally or can be produced by a separate oscillator.

The circuit arrangement may be part of a radar system for use on board a motor vehicle. The radar system may be set up such that during normal operation it switches to test mode at intervals. This can easily be done by switching on the modulator 2. Alternatively, it is also possible for the signal path between the output of the modulator 2 and the feed point into the path of the received signal 6 to be in switchable form, so that the injection of the output signal from the modulator 2 into the path of the received signal 6 can be disconnected. This allows the functionality to be monitored continuously.

What is claimed is:

1. A method for operating a mixer configured to mix a local oscillator signal and a received signal, wherein the mixer is tested by modulating the local oscillator signal by means of a modulation signal and injecting the modulated local oscillator signal into the path of the received signal.

2. The method according to claim 1, wherein the modulation signal is obtained from the local oscillator signal by frequency division.

3. The method according to claim 1, wherein in the modulation signal is independent of the local oscillator signal.

4. The method according to claim 1, wherein the modulated local oscillator signal is injected into the path of the received signal by means of a directional coupler.

5. The method according to claim 1, wherein the path of the received signal is isolated from an antenna for receiving the received signal in order to test the mixer.

6. The method according to claim 1, wherein the path of the received signal remains coupled to an antenna for receiving the received signal while the mixer is tested.

7. The method according to claim 1, wherein the received signal is the output signal from a receiver for radar signals.

8. The method according to claim 1, wherein the local oscillator signal is amplitude-modulated by means of a modulation signal.

9. The method according to claim 1, wherein the local oscillator signal is used for mixing with the received signal.

10. A circuit arrangement having:
   a mixer configured to mix a received signal and a local oscillator signal,
   a modulator with a signal input for receiving the local oscillator signal, a modulation input for receiving a modulation signal and an output, and
   a coupler which is coupled to a path for the received signal and to the output of the modulator such that a signal at the output of the modulator can be injected into the path for the received signal.

11. The circuit arrangement according to claim 10, characterized in that
   the mixer, the modulator and the coupler are integrated together in a housing.

12. The circuit arrangement according to claim 10, characterized in that
   the mixer, the modulator and the coupler are integrated in a semiconductor body.

13. The circuit arrangement according to claim 12, characterized in that
   the mixer, the modulator and the coupler are integrated in the semiconductor body in CMOS technology.

14. The circuit arrangement according to claim 10, wherein the circuit arrangement has a local oscillator for producing the local oscillator signal.

15. The circuit arrangement according to claim 10, wherein the coupler is a directional coupler.

16. The circuit arrangement according to claim 10, wherein the coupler is configured to continually injecting the output signal from the modulator into the path for the received signal.

17. The circuit arrangement according to claim 10, wherein the output of the modulator is disconnectable.

18. The circuit arrangement according to claim 10, wherein the path for the received signal is coupled to a radar receiver.

19. The circuit arrangement according to claim 10, wherein the circuit arrangement is part of a radar receiver.

20. The circuit arrangement according to claim 10, wherein the circuit arrangement is configured to process a received signal at a frequency of above 20 GHz.

21. The circuit arrangement according to claim 10, wherein the circuit arrangement has a frequency divider which has an input for receiving the local oscillator signal and an output which is coupled to the modulation input of the modulator.

22. The circuit arrangement according to claim 21, wherein the frequency divider is switchable.

23. The circuit arrangement according to claim 10, wherein the circuit arrangement is configured that it can be operated in a test mode and a reception mode, wherein the signal path for the local oscillator signal and the signal path for the received signal have the same course in test mode and in reception mode.

24. The circuit arrangement according to claim 10, wherein the mixer includes a signal input for receiving the local oscillator signal, and the signal input of the modulator is coupled to the signal input of the mixer.

25. The circuit arrangement according to claim 10, wherein the signal injected into the path for the received signal is used to test the mixer.

* * * * *